(12) United States Patent
Lee et al.

(10) Patent No.: US 8,013,254 B2
(45) Date of Patent: Sep. 6, 2011

(54) PRINTED CIRCUIT BOARD

(75) Inventors: Yong Goo Lee, Seoul (KR); Kyoung il Kang, Suwon-si (KR)

(73) Assignee: Gigalane Co. Ltd., Gyeonggi-do (KR)

( * ) Notice: Subject to any disclaimer, the term of this patent is extended or adjusted under 35 U.S.C. 154(b) by 0 days.

(21) Appl. No.: 12/866,981

(22) PCT Filed: Nov. 21, 2008

(86) PCT No.: PCT/KR2008/006897
§ 371 (c)(1),
(2), (4) Date: Aug. 10, 2010

(87) PCT Pub. No.: WO2009/102108
PCT Pub. Date: Aug. 20, 2009

(65) Prior Publication Data
US 2010/0314159 A1  Dec. 16, 2010

(30) Foreign Application Priority Data

Feb. 15, 2008  (KR) .................. 10-2008-0014110
Feb. 15, 2008  (KR) .................. 10-2008-0014163

(51) Int. Cl.
*H05K 1/00* (2006.01)
(52) U.S. Cl. .................. 174/254; 174/262; 174/263
(58) Field of Classification Search .......... 174/254, 174/262–263; 333/1, 33, 238, 246
See application file for complete search history.

(56) References Cited

U.S. PATENT DOCUMENTS

| 4,680,557 | A | * | 7/1987 | Compton ........................ 333/1 |
| 5,252,781 | A | | 10/1993 | Shirai et al. .................. 174/261 |
| 6,611,181 | B2 | * | 8/2003 | Marketkar et al. .......... 333/24 R |
| 7,298,234 | B2 | * | 11/2007 | Dutta ............................ 333/246 |
| 7,336,139 | B2 | * | 2/2008 | Blair et al. ....................... 333/1 |
| 7,378,599 | B2 | | 5/2008 | Somei ........................... 361/777 |
| 7,898,355 | B2 | * | 3/2011 | Lee .................................... 333/1 |
| 2003/0128532 | A1 | * | 7/2003 | Somei ........................... 361/777 |
| 2005/0039947 | A1 | * | 2/2005 | Ohsaka ......................... 174/255 |
| 2006/0214282 | A1 | * | 9/2006 | Sakata .......................... 257/701 |

FOREIGN PATENT DOCUMENTS

| JP | 62-009697 | 1/1987 |
| JP | 04-354398 | 12/1992 |
| JP | 2003-204128 | 7/2003 |
| JP | 2004-140308 | 5/2004 |
| KR | 20-2001-0001457 | 1/2001 |

OTHER PUBLICATIONS

International Search Report in PCT/KR2008/006897 dated Jun. 15, 2009.

* cited by examiner

*Primary Examiner* — Yuriy Semenenko
*Assistant Examiner* — Andargie M Aychillhum
(74) *Attorney, Agent, or Firm* — Harness, Dickey & Pierce, P.L.C.; Anthony G. Fussner; Kisuk Lee

(57) ABSTRACT

The present disclosure provides a printed circuit board (PCB) comprising a first ground layer extended in one direction a first dielectric layer laminated on the first ground layer and extended in the same direction as that of the first ground layer; a signal transmission line laminated on the first dielectric layer and extended in the same direction as that of the first dielectric layer; and a plurality of first ground patterns formed by etching a surface of the first ground layer in an axial direction thereof at a predetermined interval in a line, wherein the plurality of first ground patterns expose the first dielectric layer.

11 Claims, 5 Drawing Sheets

[Fig. 1]
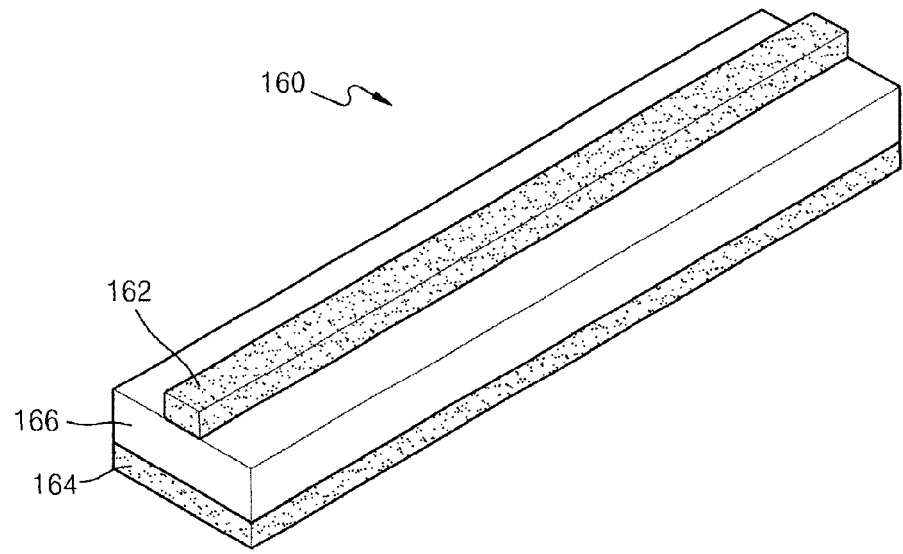
[Fig. 2]
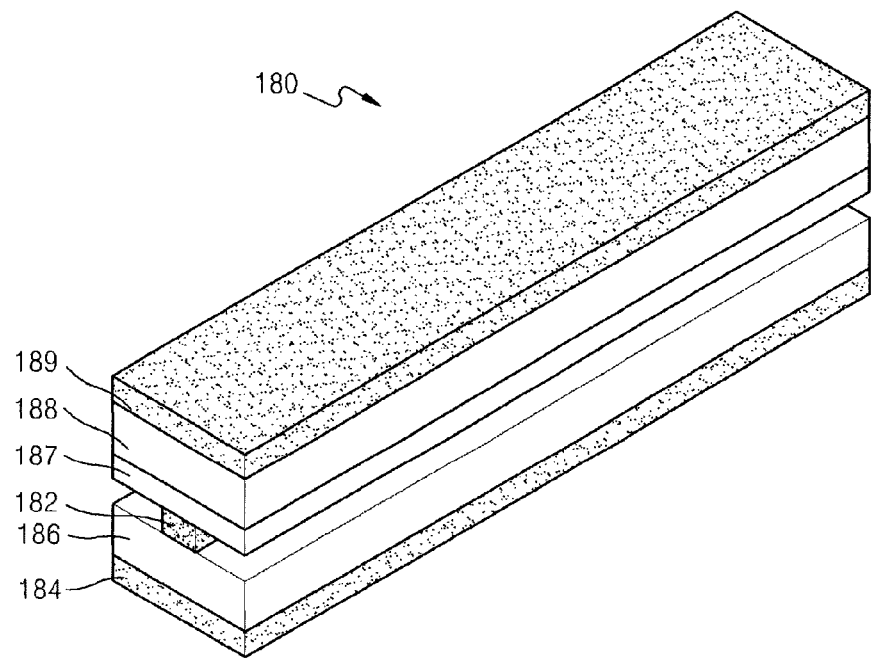

[Fig. 3]
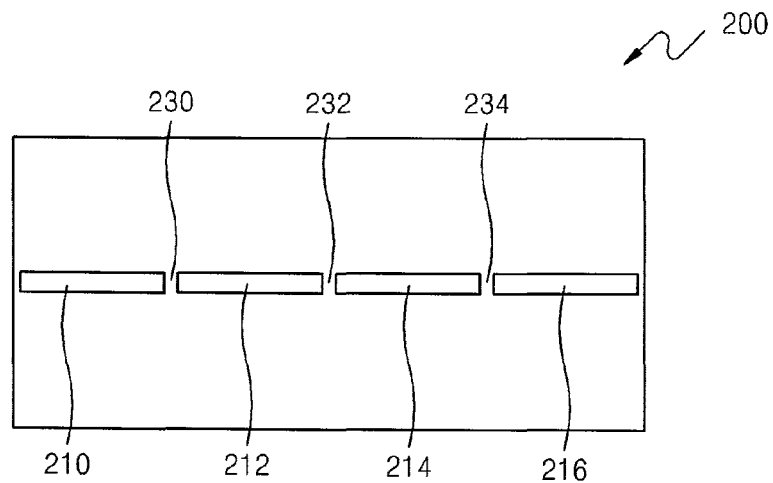
[Fig. 4]
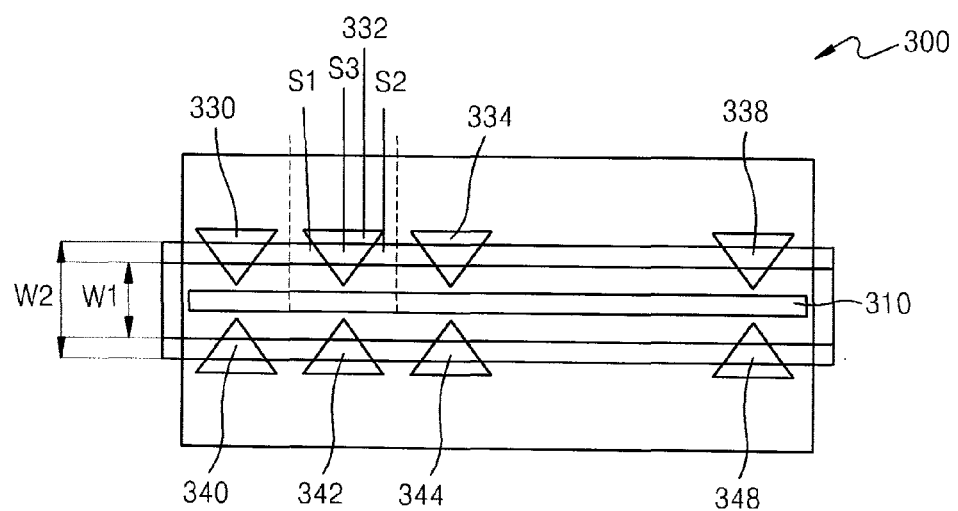

[Fig. 5]
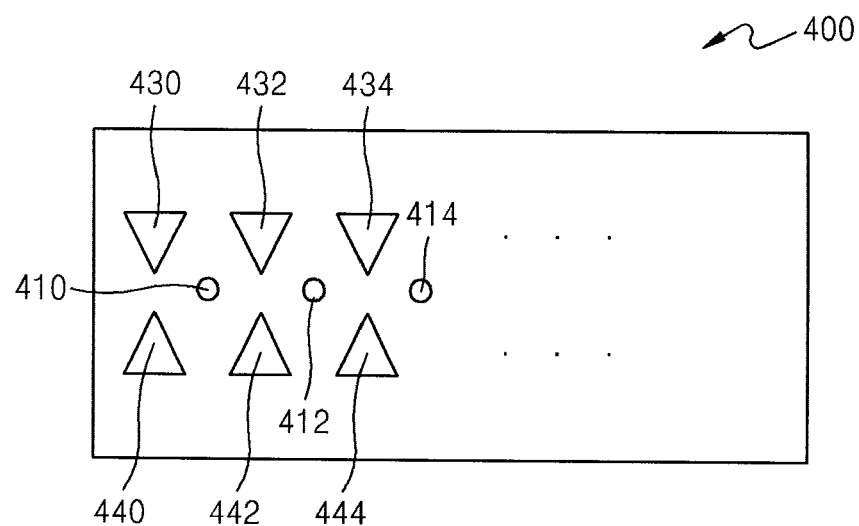
[Fig. 6]
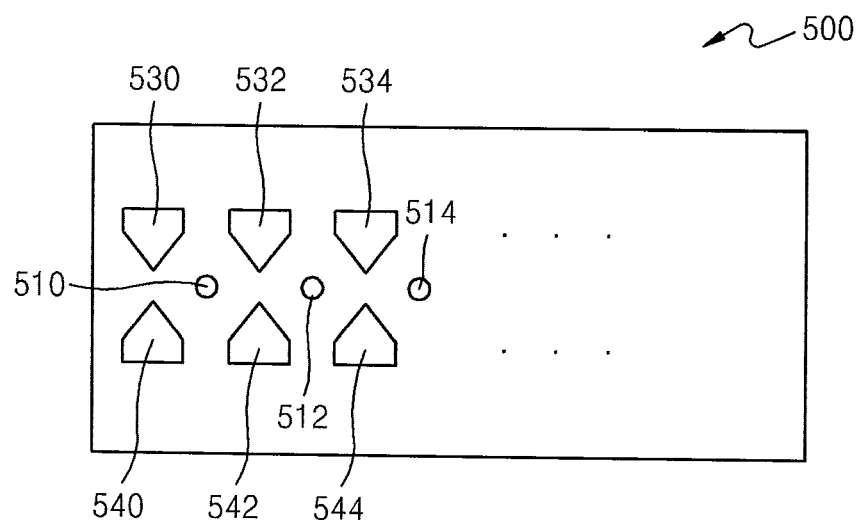

[Fig. 7]
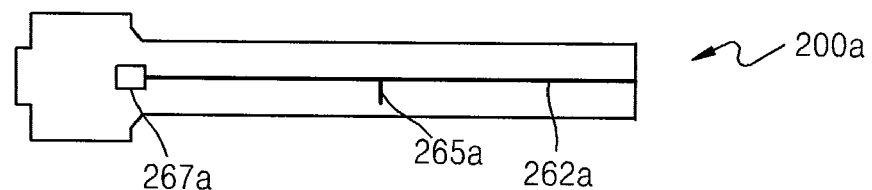
[Fig. 8]
[Fig. 9]
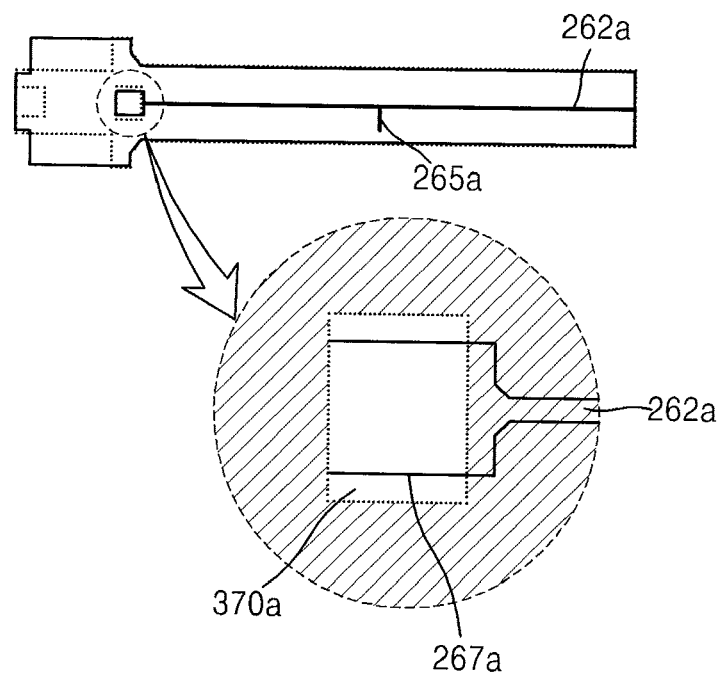

[Fig. 10]
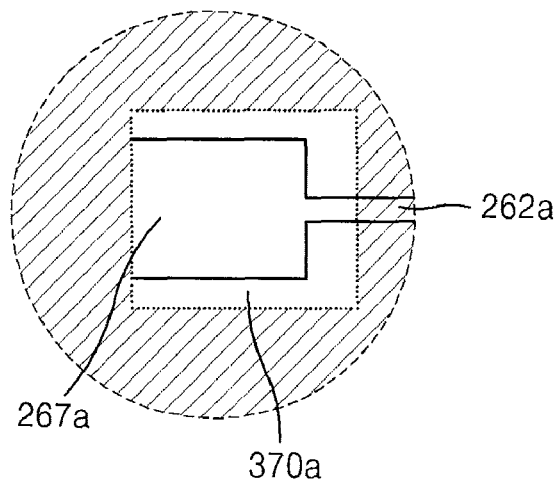
[Fig. 11]
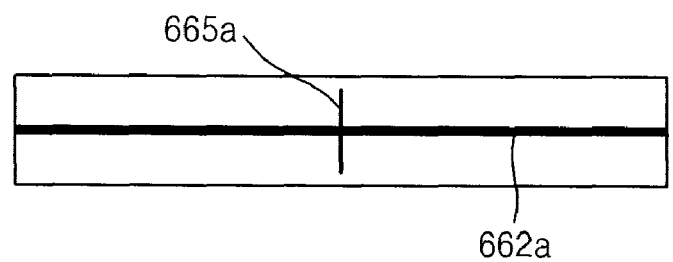
[Fig. 12]
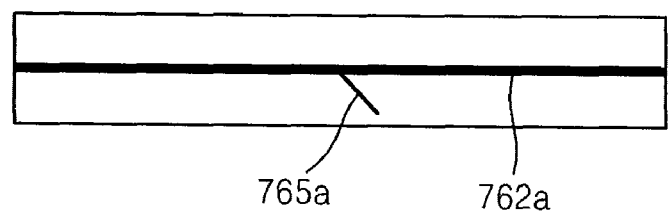

PRINTED CIRCUIT BOARD

CROSS-REFERENCE TO RELATED APPLICATIONS

This application is a national phase application of PCT Application No. PCT/KR2008/006897 filed on Nov. 21, 2008, which claims the benefit and priority to Korean Patent Application No. 10-2008-0014110 filed Feb. 15, 2008, and to Korean Patent Application No. 10-2008-0014163 filed Feb. 15, 2008. The entire disclosures of the applications identified in this paragraph are incorporated herein by references.

TECHNICAL FIELD

The present invention relates to a printed circuit board (PCB), and more particularly, to a PCB capable of increasing the width of a signal transmission line without impedance mismatching and preventing a disconnect of the signal transmission line though the PCB is bent, by exposing a part of a contactor and not exposing another part thereof.

BACKGROUND ART

Inner circuits of wireless communication devices are generally embodied on a printed circuit (PCB). Such PCB technology has been notably developed. Currently, there are generally used not only conventional stiff PCBs but also flexible PCBs capable of freely moving.

DETAILED DESCRIPTION OF THE INVENTION

Technical Problem

The present invention provides a printed circuit board (PCB) capable of increasing the width of a signal transmission line without impedance mismatching.

The present invention also provides a PCB in which a part of a contactor is exposed and another part thereof is not exposed.

Technical Solution

According to an aspect of the present invention, there is provided a printed circuit board (PCB) including a first ground layer, a first dielectric layer, a signal transmission line, laminated sequentially and extended in the same direction, and a plurality of first ground patterns. The plurality of first ground patterns are formed by etching a surface of the first ground layer in an axial direction thereof at a predetermined interval in a line. The plurality of first ground patterns expose the first dielectric layer. The PCB further includes a bonding sheet disposed on the signal transmission line, a second dielectric layer disposed on the bonding sheet, a second ground layer disposed on the second dielectric layer, and a plurality of second ground patterns formed by etching a surface of the second ground layer in an axial direction thereof at a predetermined interval in a line. The plurality of second ground patterns expose the second dielectric layer. The plurality of first ground patterns and the plurality of second ground patterns are formed along a center in the axial directions of the first ground layer and the second ground layer.

According to another aspect of the present invention, there is provided a PCB including a first ground layer extended in one direction, a first dielectric layer laminated one the first ground layer and extended in the same direction as that of the first ground layer, a signal transmission line laminated on the first dielectric layer and extended in the same direction as that of the first dielectric layer, a first ground pattern formed by etching a surface of the first ground layer in an axial direction thereof with a predetermined width, and a plurality of second ground patterns formed by etching the surface of the first ground layer at both sides of the first ground pattern in the axial direction at a predetermined interval in a line. A part of each of the plurality of second ground patterns, far from the first ground pattern, has a greater width than that of another part thereof, close to the first ground pattern, and the first ground pattern and the plurality of second ground patterns expose the first dielectric layer. The PCB further includes a bonding sheet disposed on the signal transmission line, a second dielectric layer disposed on the bonding sheet, a second ground layer disposed on the second dielectric layer, a third ground pattern formed by etching a surface of the second ground To layer in an axial direction thereof with a predetermined width, and a plurality of fourth ground patterns formed by etching the surface of second ground layer at both sides of the third ground pattern in the axial direction at a predetermined interval in a line. The third ground pattern and the plurality of fourth ground patterns expose the second dielectric layer. The first ground pattern and the third ground pattern include one or more of bridges, not etched, formed along a center of the first and third ground patterns in the axial direction thereof at a predetermined interval in a line and electrically connecting parts of the both sides of the first and third ground patterns, which are not etched.

According to still another aspect of the present invention, there is provided a PCB including a first ground layer extended in one direction, a first dielectric layer laminated on the first ground layer and extended in an axial direction of the first ground layer, a signal transmission line laminated on the first dielectric layer and extended in an axial direction of the first dielectric layer, a plurality of first ground patterns formed by etching a surface of the first ground layer in an axial direction thereof at a predetermined interval in a line, and a plurality of second ground patterns formed by etching the surface of the first ground layer at both sides of the plurality of first ground patterns at a predetermined interval in a line. When further from a center of the first ground layer, the width of each of the plurality of second ground patterns increases, which is measured in the axial direction of the first ground layer, and the plurality of first and second ground patterns expose the first dielectric layer.

The PCB further includes a bonding sheet disposed on the signal transmission line, a second dielectric layer disposed on the bonding sheet, a second ground layer disposed on the second dielectric layer, a plurality of third to ground patterns formed by etching a surface of the second ground layer in an axial direction thereof at a predetermined interval in a line, and a plurality of fourth ground patterns formed by etching the surface of the second ground layer at both sides of the plurality of third ground patterns in the axial direction of the second ground layer at a predetermined interval in a line. When further from a center of the second ground layer, the width of each of the plurality of fourth ground patterns increases, which is measured in the axial direction of the second ground layer, and the plurality of third and fourth ground patterns expose the second dielectric layer.

The plurality of first and third ground patterns are formed along the center in the axial directions of the first and second ground layers.

According to yet another aspect of the present invention, there is provided a PCB including a first ground layer extended in one direction, a first dielectric layer laminated on the first ground layer and extended in an axial direction of the first ground layer, a signal transmission line laminated on the first dielectric layer and extended in an axial direction of the first dielectric layer, a plurality of first ground patterns formed by etching a surface of the first ground layer in an axial direction thereof at a predetermined interval in a line, and a plurality of second ground patterns formed by etching the surface of the first ground layer at both sides of the plurality of first ground patterns at a predetermined interval in a line. When further from a center of the first ground layer, the width of each of the plurality of second ground patterns increases and then becomes uniform, which is measured in the axial direction of the first ground layer, and the plurality of first and second ground patterns expose the first dielectric layer. The PCB further includes a bonding sheet disposed on the signal transmission line, a second dielectric layer disposed on the bonding sheet, a second ground layer disposed on the second dielectric layer, a plurality of third ground patterns formed by etching a surface of the second ground layer in an axial direction thereof at a predetermined interval in a line, and a plurality of fourth ground patterns formed by etching the surface of the second ground layer at both sides of the plurality of third ground patterns at a predetermined interval in a line. When further from a center of the second ground layer, the width of each of the plurality of fourth ground patterns increases and then becomes uniform, which is measured in the axial direction of the second ground layer, and the plurality of third and fourth ground patterns expose the second dielectric layer. In this case, on the basis of the center on the axial directions of the first and second ground layers, a position where the width of the each of the plurality of second and fourth ground patterns becomes uniform is located outside of an edge of the signal transmission line. The PCB is a flexible PCB.

According to a further aspect of the present invention, there is provided a PCB includes a signal transmission line, a contactor, and a cover layer. The contactor is formed in a single body with the signal transmission line at an end thereof and has a width greater than that of the signal transmission line. The cover layer covers the whole surface where the signal transmission line is formed. The cover layer includes a hole exposing the contactor, excluding a part of the contactor, which is close to the signal transmission line. The signal transmission line may further include a branch. The branch is connected to a center of the signal transmission line and projected from the center of the signal transmission line in a direction opposite to that in which the signal transmission line is extended. The branch may be projected from one or more sides of the signal transmission line. The branch may be projected with an angle perpendicular to the direction in which the signal transmission layer is extended, or smaller than a right angle. The PCB may be a flexible PCB.

ADVANTAGEOUS EFFECTS

A printed circuit board (PCB) according to an embodiment of the present invention has an advantage capable of increasing the width of a signal transmission line without impedance mismatching. Also, a PCB according to another embodiment of the present invention has an advantage of preventing a disconnect of a signal transmission line though the PCB is bent, by exposing a part of a contactor and not exposing another part thereof.

BRIEF DESCRIPTION OF THE DRAWINGS

FIG. 1 is a diagram illustrating a printed circuit board (PCB);

FIG. 2 is a diagram illustrating another PCB;

FIG. 3 is a diagram illustrating a ground layer according to a first embodiment of the present invention;

FIG. 4 is a diagram illustrating a ground layer according to a second embodiment of the present invention;

FIG. 5 is a diagram illustrating a ground layer according to a third embodiment of the present invention;

FIG. 6 is a diagram illustrating a ground layer according to a fourth embodiment of the present invention;

FIG. 7 is a diagram illustrating a PCB according to an embodiment of the present invention;

FIG. 8 is a diagram illustrating a cover layer according to an embodiment of the present invention;

FIG. 9 is a diagram illustrating the PCB of FIG. 7, coupled with the cover layer of FIG. 8;

FIG. 10 is a diagram illustrating a comparative example to be compared with that of FIG. 9;

FIG. 11 is a diagram illustrating a PCB according to another embodiment of the present invention;

FIG. 12 is a diagram illustrating a PCB according to still another embodiment of the present invention.

BEST MODE FOR CARRYING OUT THE INVENTION

To fully understand advantages of operations of the present invention and the objects obtained by embodiments of the present invention, it is required to refer to attached drawings illustrating preferable embodiments of the present invention and contents shown in the drawings. Hereinafter, the preferable embodiments of the present invention will be described in detail with reference to the attached drawings. The same reference numerals shown in each drawing indicate the same elements.

Printed circuit boards (PCBs) disclosed in the description may be a general PCB or a flexible PCB.

FIG. 1 is a diagram illustrating a PCB 160. The PCB 160 includes a first ground layer 164, a first dielectric layer 166, and a signal transmission line 162. The first ground layer 164, the first dielectric layer 166, and the signal transmission line 162 are sequentially laminated and extended in the same direction. The first to ground layer 164 is formed of a metallic material such as copper and connected to a ground. The first dielectric layer 166 is formed of a dielectric material such as polyimide. The signal transmission line 162 is formed of a metallic material such as copper.

FIG. 2 is a diagram illustrating another PCB 180. The PCB 180 includes a first ground layer 184, a first dielectric layer 186, a signal transmission line 182, a bonding sheet 187, a second dielectric layer 188, and a second ground layer 189. Different from the PCB 160 of FIG. 1, the PCB 180 further includes the bonding sheet 187, the second dielectric layer 188, and the second ground layer 189. The second ground layer 189 is formed of a metallic material such as copper and connected to a ground. The second dielectric layer 188 is formed of a dielectric material such as polyimide. The bonding sheet 187 bonds the second dielectric layer 188 and the second ground layer 189 to the signal transmission line 182.

FIG. 3 is a diagram illustrating a ground layer 200 according to a first embodiment of the present invention. Referring to FIG. 3, the ground layer 200 includes a plurality of ground patterns 210, 212, 214, and 216. The plurality of ground patterns 210, 212, 214, and 216 are formed by etching a surface of the ground layer 200 until a dielectric layer (not shown) is exposed. The plurality of ground patterns 210, 212, 214, and 216 may be formed along a center in an axial direction of the ground layer 200 at a predetermined interval in a line. Since the plurality of ground patterns 210, 212, 214, and 216 are formed at the predetermined interval, there are formed bridges 230, 232, and 234, not etched, between the plurality of ground patterns 210, 212, 214, and 216.

The plurality of ground patterns 210, 212, 214, and 216 may have a rectangular shape as shown in FIG. 3 or another shape. To reduce a loss of a conductor, it is required to broaden the width of a signal transmission line. However, when increasing the width of a signal transmission line, a capacitance between the signal transmission line and a ground layer increases, thereby decreasing impedance. Accordingly, when increasing the width of a signal transmission line, impedance mismatching occurs. However, in the case of the ground layer 200, due to the plurality of ground patterns 210, 212, 214, and 216, there is generated an effect of decreasing the width of the ground layer 200. In this case, a capacitance between a signal transmission line and the ground layer 200 becomes smaller, thereby increasing impedance. Accordingly, in the case of a PCB including the ground layer 200, it is possible to increase the width of a signal without impedance mismatching.

FIG. 4 is a diagram illustrating a ground layer 300 according to a second embodiment of the present invention.

Referring to FIG. 4, the ground layer 300 includes a first ground pattern 310 and a plurality of second ground patterns 330, 332, 334, 338, 340, 342, 344, and 348. The plurality of second ground patterns 330, 332, 334, 338, 340, 342, 344, and 348 are disposed at both sides of the first ground pattern 310 in an axial direction of the ground layer 300. The first ground pattern 310 and the plurality of second ground patterns 330, 332, 334, 338, 340, 342, 344, and 348 are formed by etching a surface of the ground layer 300 until a dielectric layer (not shown) is exposed. In each of the plurality of second ground patterns 330, 332, 334, 338, 340, 342, 344, and 348, a part far from the first ground pattern 310 has a greater width than that of another part close to the first ground pattern 310. For example, as shown in FIG. 4, the plurality of second ground patterns 330, 332, 334, 338, 340, 342, 344, and 348 may have a triangular shape.

In the case of a PCB including the ground layer 300, it is possible to increase the width of a signal transmission line without impedance mismatching, which will be described. Referring to FIG. 4, W1 and W2 indicate widths of the signal transmission line. To compare the magnitude of a capacitance between the signal transmission line and the ground layer 300 when the width of the signal transmission line is W1 with the magnitude of a capacitance between the signal transmission line and the ground layer 300 when the width of the signal transmission line is W2, an area overlapping the signal transmission line with the ground layer 300 when the width of the signal transmission line is W1 is compared with that of an area overlapping the signal transmission line with the ground layer 300 when the width of the signal transmission line is W2. When the width of the signal transmission line increases from W1 to W2, the overlapped area increases by S1+S2 and become narrower by S3. In this case, when forming the second ground pattern 332 in such a way that S1+S2 is equal to S3, though the width of the signal transmission line increases from W1 to W2, the width of the overlapped area between the signal transmission line and the ground layer 300 is maintained as it is. Accordingly, since the magnitude of the capacitance between the signal transmission line and the ground layer 300 is not changed, it is possible to increase the width of the signal transmission line without impedance mismatching.

FIG. 5 is a diagram illustrating a ground layer 400 according to a third embodiment of the present invention.

Referring to FIG. 5, the ground layer 400 includes a plurality of first ground patterns 410, 412, and 414 and a plurality of second ground patterns 430, 432, 434, 440, 442, and 444. The plurality of first ground patterns 410, 412, and 414 are disposed at a predetermined interval in a line in an axial direction of the ground layer 400. The plurality of first ground patterns 410, 412, and 414 may be disposed along a center in the axial direction of the ground layer 400. The plurality of second ground patterns 430, 432, 434, 440, 442, and 444 are disposed at both sides of the plurality of first ground patterns 410, 412, and 414 in the axial direction of the ground layer 400. The plurality of first and second ground patterns 410, 412, 414, 430, 432, 434, 440, 442, and 444 are formed by etching a surface of the ground layer 400 until a dielectric layer (not shown) is exposed. The plurality of first ground patterns 410, 412, and 414 may have a circular shape as shown in FIG. 5 or another shape.

In each of the plurality of second ground patterns 430, 423, 434, 440, 442, and 444, a part far from the center of the ground layer 400 in the axial direction thereof has a greater width than that of another part close to the center thereof. In addition, when further from the center of the ground layer 400, the width of each of the plurality of second ground patterns 430, 432, 434, 440, 442, and 444 may increase more and more, which is measured in the axial direction of the ground layer 400. For example, as shown in FIG. 4, the plurality of second ground patterns 430, 432, 434, 440, 442, and 444 may have a triangular shape. The plurality of second ground patterns 430, 432, 434, 440, 442, and 444 have the same shape as that of the plurality of second ground patterns 330, 332, 334, 340, 342, and 344 shown in FIG. 4. Accordingly, in the case of a PCB including the ground layer 400, though the width of a signal transmission line is changed, the magnitude of a capacitance between the signal transmission line and the ground layer 400 is not changed. Therefore, it is possible to increase the width of the signal transmission line without impedance mismatching.

On the other hand, the ground layer 300 of FIG. 4 may include the plurality to of ground patterns 210, 212, 214, and 216 shown in FIG. 3 or the plurality of first ground patterns 410, 412, and 414 shown in FIG. 5, instead of the first ground pattern 310.

FIG. 6 is a diagram illustrating a ground layer 500 according to a fourth embodiment of the present invention.

With respect to the ground layer 500 shown in FIG. 6, only parts different from the ground layer 400 shown in FIG. 5 will be described. Referring to FIG. 6, in each of a plurality of second ground patterns 530, 532, 534, 540, 542, and 544, when further from a center of the ground layer 500, the width of each of the plurality of second ground patterns 530, 532, 534, 540, 542, and 544 increases more and more and becomes uniform, which is measured in an axial direction of the ground layer 500. For example, as shown in FIG. 6, the plurality of second ground patterns 530, 532, 534, 540, 542, and 544 may have a shape formed by coupling a triangle with a square. In the case of the ground layer 500 shown in FIG. 6, it is possible to increase the width of a signal transmission line without impedance matching.

Also, on the basis of the center of the ground layer 500 in the axial direction thereof, a position where the width of each of the plurality of second ground patterns 530, 532, 534, 540, 542, and 544 becomes uniform may be located outside of an edge of the signal transmission line. The ground layers 300, 400, 500, and 500 shown in FIGS. 3 to 6 may be one of the first ground layers 164 and 184 and the second ground layer 189 shown in FIGS. 1 and 2. That is, ground patterns may be formed on surfaces of the first ground layers 164 and 184 and on a top surface of the second ground layer 189 shown in FIGS. 1 and 2. Also, ground patterns may be formed on one of the first ground layer 184 and the second ground layer 189 shown in FIG. 2. Hereinafter, there will be described a PCB preventing a disconnect of a signal transmission line though the PCB is bent, by exposing a part of a contactor and not exposing another part thereof.

FIG. 7 is a diagram illustrating a PCB 200*a* according to an embodiment of the present invention. Referring to FIG. 7, the PCB 200*a* includes a signal transmission line 262*a* and a contactor 267*a*. The contactor 267*a* is connected to an end of the signal transmission line 262*a* and formed in a single body with the signal transmission line 262*a*. The width of the contactor 267*a* is greater than that of the signal transmission line 262*a*.

FIG. 8 is a diagram illustrating a cover layer 300*a* according to an embodiment of the present invention. FIG. 9 is a diagram illustrating the PCB 200*a* of FIG. 7, coupled with the cover layer 300*a* of FIG. 8. Referring to FIGS. 8 and 9, the cover layer 300*a* covers the whole surface where the signal transmission line 262*a* is formed in the PCB 200*a*. The cover layer 300*a* includes a hole 370*a*. The hole 370*a* exposes an area of the contactor 267*a*, excluding a part close to the signal transmission line 262*a*. That is, the cover layer 300*a* does not expose a part where the signal transmission line 262*a* is in contact with the contactor 267*a*. As described above, since not exposing a part where a thickness is rapidly changed, it is possible to prevent a disconnect of the signal transmission line 262*a* when the PCB 200*a* is bent.

FIG. 10 is a diagram illustrating a comparative example to be compared with that of FIG. 9. As shown in FIG. 10, when a part where the signal transmission line 262*a* is in contact with the contactor 267*a*, that is, a part where a thickness is rapidly changed, is exposed by the hole 370*a*, it is easy that the signal transmission line 262*a* is disconnected when the PCB 200*a* is bent. Referring to FIG. 7, the PCB 200*a* may further include a branch 265*a*. The branch 265*a* is connected to a center of the signal transmission line 262*a* and projected from the center of the signal transmission line 262*a* in a direction opposite to that where the signal transmission line 262*a* is extended.

The branch 265*a* may be one or more sides of the signal transmission line 262*a*. For example, in FIG. 7, there is shown the branch 265*a* projected from one side of the signal transmission line 262*a*, perpendicularly to a direction where the signal transmission line 262*a* is extended. Like this, the branch 265*a* connected to the center of the signal transmission line 262*a* prevents the occurrence of a resonance.

FIG. 11 is a diagram illustrating a PCB 600*a* according to another embodiment of the present invention.

Referring to FIG. 11, in the case of the PCB 600*a*, a branch 665*a* is projected from both sides of a signal transmission line 662*a*, perpendicularly to a direction where the signal transmission line 662*a* is extended.

FIG. 12 is a diagram illustrating a PCB 700*a* according to still another embodiment of the present invention. Referring to FIG. 12, in the case of the PCB 700*a*, a branch 765*a* is projected from one side of a signal transmission line 762*a*, at an angle smaller than a right angle to a direction where the signal transmission line 762*a* is extended.

As described above, exemplary embodiments have been shown and described. Though specific terms are used herein, they are just used for describing the present invention but do not limit the meanings and the scope of the present invention disclosed in the claims. Therefore, it would be appreciated by those skilled in the art that changes may be made to these embodiments without departing from the principles and spirit of the invention. Accordingly, the technical scope of the present invention is defined by the claims and their equivalents.

INDUSTRIAL APPLICABILITY

The present invention may be applied to the field of manufacturing printed circuit boards.

The invention claimed is:

1. A PCB comprising:
a first ground layer extended in one direction;
a first dielectric layer laminated one the first ground layer and extended in the same direction as that of the first ground layer;
a signal transmission line laminated on the first dielectric layer and extended in the same direction as that of the first dielectric layer;
a first ground pattern formed by etching a surface of the first ground layer in an axial direction thereof with a predetermined width; and
a plurality of second ground patterns formed by etching the surface of the first ground layer at both sides of the first ground pattern in the axial direction at a predetermined interval in a line,
wherein a part of each of the plurality of second ground patterns, far from the first ground pattern, has a greater width than that of another part thereof, close to the first ground pattern, and
wherein the first ground pattern and the plurality of second ground patterns expose the first dielectric layer.

2. The PCB of claim 1, further comprising:
a bonding sheet disposed on the signal transmission line;
a second dielectric layer disposed on the bonding sheet;
a second ground layer disposed on the second dielectric layer;
a third ground pattern formed by etching a surface of the second ground layer in an axial direction thereof with a predetermined width; and
a plurality of fourth ground patterns formed by etching the surface of second ground layer at both sides of the third ground pattern in the axial direction at a predetermined interval in a line,
wherein the third ground pattern and the plurality of fourth ground patterns expose the second dielectric layer.

3. The PCB of claim 2, wherein the first ground pattern and the third ground pattern comprise one or more of bridges, not etched, formed along a center of the first and third ground patterns in the axial direction thereof at a predetermined interval in a line and electrically connecting parts of the both sides of the first and third ground patterns, which are not etched.

4. The PCB of claim 1, wherein the PCB is flexible.

5. A PCB comprising:
a first ground layer extended in one direction;
a first dielectric layer laminated on the first ground layer and extended in an axial direction of the first ground layer;
a signal transmission line laminated on the first dielectric layer and extended in an axial direction of the first dielectric layer;
a plurality of first ground patterns formed by etching a surface of the first ground layer in an axial direction thereof at a predetermined interval in a line; and
a plurality of second ground patterns formed by etching the surface of the first ground layer at both sides of the plurality of first ground patterns at a predetermined interval in a line, wherein, when further from a center of the first ground layer, the width of each of the plurality of second ground patterns increases, which is measured in the axial direction of the first ground layer, and the plurality of first and second ground patterns expose the first dielectric layer.

6. The PCB of claim 5, further comprising:

a bonding sheet disposed on the signal transmission line;

a second dielectric layer disposed on the bonding sheet;

a second ground layer disposed on the second dielectric layer;

a plurality of third ground patterns formed by etching a surface of the second ground layer in an axial direction thereof at a predetermined interval in a line; and a plurality of fourth ground patterns formed by etching the surface of the second ground layer at both sides of the plurality of third ground patterns in the axial direction of the second ground layer at a predetermined interval in a line, wherein, when further from a center from the second ground layer, the width of each of the plurality of fourth ground patterns increases, which is measured in the axial direction of the second ground layer, and wherein the plurality of third and fourth ground patterns expose the second dielectric layer.

7. The PCB of claim 6, wherein the plurality of first and third ground patterns are formed along the center in the axial directions of the first and second ground layers.

8. The PCB of claim 5, wherein, when further from a center of the first ground layer, the width of each of the plurality of second ground patterns increases and then becomes uniform.

9. The PCB of claim 8, further comprising:

a bonding sheet disposed on the signal transmission line;

a second dielectric layer disposed on the bonding sheet;

a second ground layer disposed on the second dielectric layer;

a plurality of third ground patterns formed by etching a surface of the second ground layer in an axial direction thereof at a predetermined interval in a line; and a plurality of fourth ground patterns formed by etching the surface of the second ground layer at both sides of the plurality of third ground patterns at a predetermined interval in a line, wherein, when further from a center of the second ground layer, the width of each of the plurality of fourth ground patterns increases and then becomes uniform, which is measured in the axial direction of the second ground layer, and wherein the plurality of third and fourth ground patterns expose the second dielectric layer.

10. The PCB of claim 9, wherein, on the basis of the center on the axial directions of the first and second ground layers, a position where the width of the each of the plurality of second and fourth ground patterns becomes uniform is located outside of an edge of the signal transmission line.

11. The PCB of claim 5, wherein the PCB is flexible.

* * * * *